(12) United States Patent
Wojtczak et al.

(10) Patent No.: US 11,508,569 B2
(45) Date of Patent: Nov. 22, 2022

(54) SURFACE TREATMENT COMPOSITIONS AND METHODS

(71) Applicant: Fujifilm Electronic Materials U.S.A., Inc., N. Kingstown, RI (US)

(72) Inventors: William A. Wojtczak, Mesa, AZ (US); Kazutaka Takahashi, Gilbert, AZ (US); Atsushi Mizutani, Shizuoka (JP); Thomas Dory, Gilbert, AZ (US); Keeyoung Park, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 16/983,119

(22) Filed: Aug. 3, 2020

(65) Prior Publication Data

US 2021/0057210 A1   Feb. 25, 2021

Related U.S. Application Data

(60) Provisional application No. 62/889,615, filed on Aug. 21, 2019.

(51) Int. Cl.
*H01L 21/02* (2006.01)
*B08B 7/00* (2006.01)

(52) U.S. Cl.
CPC ...... *H01L 21/02057* (2013.01); *B08B 7/0014* (2013.01)

(58) Field of Classification Search
None
See application file for complete search history.

(56) References Cited

U.S. PATENT DOCUMENTS

| | | | |
|---|---|---|---|
| 6,177,142 B1 | 1/2001 | Felts | |
| 9,536,797 B2 | 1/2017 | Igarashi et al. | |
| 9,620,353 B2 | 4/2017 | Igarashi et al. | |
| 9,673,037 B2 | 6/2017 | Sirard et al. | |
| 10,121,646 B2 | 11/2018 | Kagawa et al. | |
| 10,153,181 B2 | 12/2018 | Sasaki et al. | |
| 10,192,733 B2 | 1/2019 | Igarashi et al. | |
| 2015/0064911 A1 | 3/2015 | Kaneko et al. | |
| 2015/0155159 A1 | 6/2015 | Igarashi et al. | |
| 2015/0262869 A1 | 9/2015 | Naik et al. | |
| 2015/0273535 A1 | 10/2015 | Sato et al. | |
| 2017/0062244 A1 | 3/2017 | Sato et al. | |
| 2017/0345683 A1 | 11/2017 | Sasaki et al. | |
| 2018/0182646 A1 | 6/2018 | Sasaki et al. | |
| 2019/0030576 A1 | 1/2019 | Hanawa et al. | |
| 2019/0091736 A1 | 3/2019 | Okutani et al. | |
| 2019/0176179 A1 | 6/2019 | Yoshida et al. | |
| 2019/0333755 A1 | 10/2019 | Hanawa et al. | |
| 2020/0152447 A1 | 5/2020 | Sasaki et al. | |

FOREIGN PATENT DOCUMENTS

| | | | | |
|---|---|---|---|---|
| JP | 2013-33817 | 2/2013 | ........... | H01L 21/304 |
| JP | 2013-42093 | 2/2013 | ........... | H01L 21/304 |
| JP | 2013-42094 | 2/2013 | ........... | H01L 21/304 |
| JP | 5681560 | 1/2015 | ........... | H01L 21/304 |
| JP | 6259299 | 12/2017 | ........... | H01L 21/304 |
| WO | WO 2018/128008 | 7/2018 | ........... | H01L 21/304 |
| WO | WO 2018/170382 | 9/2018 | ........... | C23C 16/455 |
| WO | WO 2019/021664 | 1/2019 | ........... | H01L 21/304 |

OTHER PUBLICATIONS

International Search Report and Written Opinion of the International Searching Authority for International Application No. PCT/US2020/044700, dated Jan. 6, 2021, 12 pages.

*Primary Examiner* — Eric W Golightly
*Assistant Examiner* — Arlyn I Rivera-Cordero
(74) *Attorney, Agent, or Firm* — Fish & Richardson P.C.

(57) ABSTRACT

This disclosure relates to methods and compositions for treating a semiconductor substrate having a pattern disposed on a surface of the substrate. The methods can include a) supplying a sublimating material to a substrate having a pattern disposed on a surface thereof; b) maintaining the sublimating material on the surface for a time sufficient to modify the surface; c) solidifying the sublimating material on the surface; and d) removing by sublimation the sublimating material disposed on the surface.

24 Claims, No Drawings

SURFACE TREATMENT COMPOSITIONS AND METHODS

CROSS-REFERENCE TO RELATED APPLICATION

The present application claims priority to U.S. Provisional Application Ser. No. 62/889,615, filed on Aug. 21, 2019, the contents of which are hereby incorporated by reference in their entirety.

FIELD OF THE DISCLOSURE

The present disclosure relates generally to surface treatment, as well as related compositions and methods.

BACKGROUND OF THE DISCLOSURE

At sub-20 nm critical dimensions, pattern collapse of FinFET's and dielectric stacks during wet clean and drying has become a major problem in semiconductor manufacturing processes. The conventional theory of pattern collapse implicates high capillary forces during rinse and dry as major contributors leading to the collapse phenomenon. However, other chemical and substrate properties may play an important role as well, namely, liquid surface tension and viscosity, substrate mechanical strength, pattern density and aspect ratio, and cleaner chemistry damage to substrate surfaces.

SUMMARY OF THE DISCLOSURE

It has been found that certain surface treatment compositions can impart the surface of a semiconductor substrate (e.g., a wafer such as a silicon or copper wafer) with a hydrophobic layer (e.g., a hydrophobic monolayer) to reduce the capillary forces that drive pattern collapse during a subsequent semiconductor manufacturing process. These surface treatment compositions (also referred herein as sublimating materials) can be removed by sublimation, which further minimizes the pattern collapse as a subsequent rinsing or drying process can be eliminated.

In one aspect, this disclosure features a method of treating a substrate that includes the steps of: a) supplying a sublimating material to a substrate having a pattern disposed on a surface thereof, in which the sublimating material includes a sublimating compound and a surface modification agent; b) maintaining the sublimating material on the surface for a time sufficient to modify the surface; c) solidifying the sublimating material on the surface; and d) removing by sublimation the sublimating material disposed on the surface.

In another aspect, this disclosure features a method of treating a substrate that includes the steps of: a) supplying a sublimating material to a substrate having a pattern disposed on a surface thereof, in which the sublimating material includes a sublimating compound and the sublimating compound is a surface modification agent; b) maintaining the sublimating material on the surface for a time sufficient to modify the surface; c) solidifying the sublimating material on the surface; and d) removing by sublimation the sublimating material disposed on the surface.

In another aspect, this disclosure features a sublimating material that includes a sublimating compound in an amount of from about 40% by weight to about 99.5% by weight of the sublimating material; and a surface modification agent in an amount of from about 0.5% by weight to about 10% by weight of the sublimating material.

In another aspect, this disclosure features a sublimating material that includes (e.g., comprises, consists essentially of, or consists of) a sublimating compound in an amount of from about 40% by weight to about 99.5% by weight of the sublimating material; a catalyst in an amount of from about 0.1% by weight to about 10% by weight of the sublimating material; and a solvent in an amount of from about 0.1% by weight to about 50% by weight of the sublimating material.

In still another aspect, this disclosure features a sublimating material that includes (e.g., comprises, consists essentially of, or consists of) a sublimating compound in an amount of from about 40% by weight to about 99.5% by weight of the sublimating material; and a solvent in an amount of from about 0.1% by weight to about 50% by weight of the sublimating material. The sublimating compound can be octamethylcyclotetrasiloxane, trimethylsilanol, t-hexyldimethylcholorosilane, 1,3-bis(heptadecafluoro-1,1,2,2-tetrahydrodecyl)tetramethyldisiloxane, triisopropyldimethylaminosilane, N-(trimethylsilyl)acetamide, or tris(trimethylsilyl)phosphate Other features, objects, and advantages of the invention will be apparent from the description and the claims.

DETAILED DESCRIPTION OF THE DISCLOSURE

As defined herein, unless otherwise noted, all percentages expressed should be understood to be percentages by weight to the total weight of a composition. Unless otherwise noted, the properties mentioned here are measured at atmospheric pressure. The term "solvent" mentioned herein, unless otherwise noted, refers to a single solvent or a combination of two or more (e.g., three or four) solvents. In the present disclosure, "ppm" means "parts-per-million", "ppb" means "parts-per-billion" and "ppt" means "parts-per-trillion".

In general, this disclosure relates to surface treatment compositions and methods. The surface treatment compositions described herein are also referred to as sublimating materials as they can be removed by sublimation. In some embodiment, the surface treatment methods described herein can be performed, for example, by a) supplying a sublimating material to a substrate (e.g., a semiconductor substrate) having a pattern disposed on a surface thereof; b) maintaining the sublimating material on the surface for a time sufficient to modify the surface; c) solidifying the sublimating material on the surface; and d) removing by sublimation the sublimating material disposed on the surface. The pattern can include a feature having a dimension of at most about 20 nm. In some embodiments, the sublimating material can form a surface treatment layer (e.g., a hydrophobic monolayer) on the surface of the substrate to reduce pattern collapse (e.g., by forming a surface having a water contact angle of at least about 50 degrees).

In some embodiments, semiconductor substrate that can be treated by the sublimating materials described herein can be constructed of silicon, silicon germanium, silicon nitride, copper, Group III-V compounds such as GaAs, or any combination thereof. In some embodiments, the semiconductor substrate can be a silicon wafer, a copper wafer, a silicon dioxide wafer, a silicon nitride wafer, a silicon oxynitride wafer, a carbon doped silicon oxide wafer, a SiGe wafer, or a GaAs wafer. The semiconductor substrate can additionally contain exposed integrated circuit structures such as interconnect features (e.g., metal lines and dielectric materials) on its surfaces. Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and/or CoSn. The semiconductor substrate can also contain layers of interlayer dielectrics, silicon oxide, silicon nitride, titanium nitride, silicon carbide, silicon oxide carbide, silicon oxide nitride, titanium oxide, and/or carbon doped silicon oxides.

In some embodiments, the semiconductor substrate surface to be treated by the sublimating materials described herein includes features containing $SiO_2$, SiN, TiN, SiOC, SiON, Si, SiGe, Ge, and/or W. In some embodiments, the substrate semiconductor surface includes features containing $SiO_2$ and/or SiN.

In general, the semiconductor substrate surface to be treated by the sublimating materials described herein includes patterns formed by a prior semiconductor manufacturing process (e.g., a lithographic process including applying a photoresist layer, exposing the photoresist layer to an actinic radiation, developing the photoresist layer, etching the semiconductor substrate beneath the photoresist layer, and/or removing the photoresist layer). In some embodiments, the patterns can include features having at least one (e.g., two or three) dimension (e.g., a length, a width, and/or a depth) of at most about 20 nm (e.g., at most about 15 nm, at most about 10 nm, or at most about 5 nm) and/or at least about 1 nm (e.g., at least about 2 nm or at least about 5 nm).

In general, the sublimating materials described herein include at least one (e.g., two or three) sublimating compound, which can be a liquid or a solid at 25° C. In some embodiments, the sublimating compound is the component in the sublimating materials that can be sublimed in the surface treatment methods described herein.

In some embodiments, the sublimating compound can have a melting point of at least about −20° C. (e.g., at least about −15° C., at least about −10° C., at least about −5° C., or at least about 0° C.) and/or at most about 60° C. (e.g., at most about 55° C., at most about 50° C., at most about 45° C., at most about 40° C., at most about 35° C., at most about 30° C., at most about 25° C., or at most about 20° C.) under atmospheric pressure. Without wishing to be bound by theory, it is believed that a compound having such a melting point can be suitable for sublimation.

In some embodiments, the sublimating compound can have a vapor pressure of at least about 1 mm Hg (e.g., at least about 2 mm Hg, at least about 3 mm Hg, at least about 5 mm Hg, at least about 10 mm Hg, at least about 15 mm Hg, or at least about 20 mm Hg) and/or at most about 100 mm Hg (e.g., at most about 90 mm Hg, at most about 80 mm Hg, at most about 70 mm Hg, at most about 60 mm Hg, at most about 50 mm Hg, or at most about 25 mm Hg) at 25° C. Without wishing to be bound by theory, it is believed that a compound having a vapor pressure lower than about 1 mm Hg at 25° C. cannot be sublimed easily. Further, without wishing to be bound by theory, it is believed that a compound having a vapor pressure higher than about 100 mm Hg at 25° C. evaporates too easily and may not stay on a surface of a semiconductor substrate for a period sufficient to treat the surface.

In some embodiments, the sublimating compound can have a surface tension of at least about 15 mN/m (e.g., at least about 20 mN/m, at least about 25 mN/m, or at least about 30 mN/m) and/or at most about 65 mN/m (e.g., at most about 60 mN/m, at most about 55 mN/m, at most about 50 mN/m, at most about 45 mN/m, at most about 40 mN/m, or at most about 35 mN/m) at 25° C. Without wishing to be bound by theory, it is believed that, in some embodiments, a compound having a surface tension in the above range can form a surface having a relatively large water contact angle (e.g., at least about 50 degrees) and reduce pattern collapse.

In some embodiments, the sublimating compound can have a viscosity of at least about 0.5 centistokes (e.g., at least about 0.6 centistokes, at least about 0.8 centistokes, at least about 1 centistoke, at least about 1.2 centistokes, at least about 1.4 centistokes, at least about 1.6 centistokes, at least about 1.8 centistokes, or at least about 2 centistokes) and/or at most about 5 centistokes (e.g., at most about 4.8 centistokes, at most about 4.6 centistokes, at most about 4.5 centistoke, at most about 4.4 centistokes, at most about 4.2 centistokes, at most about 4 centistokes, at most about 3.5 centistokes, or at most about 3 centistokes) at 25° C.

In some embodiments, the sublimating compound described herein is highly pure. In some embodiments, the purity of the sublimating compound is at least about 99.9% (e.g., at least about 99.99% or at least about 99.999%) or 100%. In some embodiments, the sublimating compound can have a total metal content of 0 to 1 ppb (e.g., 0 to 500 ppt or 0 to 300 ppt) in mass. In some embodiments, the total number of the particles having a size of 0.1 μm or more in a sublimating compound described herein is at most 200 (e.g., at most 150, at most 100, at most 80, at most 60, or at most 50) per 1 ml of the sublimating compound. The number of "particles" in a liquid medium can be counted by a light scattering type in-liquid particle counter and is referred as LPC (liquid particle count).

In some embodiments, the sublimating compound described herein does not have any substantial volume change during the phase change from liquid to solid upon freezing, which can reduce pattern collapse or damage. In some embodiments, during sublimation, the sublimating compound can be removed uniformly without the need of any subsequent rinsing or drying, which can further reduce pattern collapse or damage.

In general, the sublimating compound described herein can have at least one (e.g., two, three, or all) of the properties described above. Examples of suitable sublimating compounds include t-butanol, glacial acetic acid, octamethylcyclotetrasiloxane, pentafluorophenol, 2-acetyl-5-methyl furan, p-chlorotoluene, acrylic acid, pyrimidine, 4-methyl thiazole, p-xylene, ethylene dibromide, paraldehyde, ethylenediamine, 1,4-dioxane, formic acid, hexafluorobenzene, benzene, cyclohexane, 4-pyridinol, camphene, 2,2-dimethyl-1-propanol, cyanamide, dimethyl carbonate, trimethylsilanol, dimethyl sulfoxide, cyclohexanol, and trimethylacetonitrile.

In some embodiment, a sublimating compound described herein is also a surface modification agent (e.g., having surface modification functions such as forming a hydrophobic layer (e.g., a hydrophobic monolayer) on a semiconductor substrate surface to reduce pattern collapse during a rinsing or drying process). Examples of such sublimating compounds include Si-containing compounds such as octamethylcyclotetrasiloxane, trimethylsilanol, t-hexyldimethylcholorosilane, 1,3-bis(heptadecafluoro-1,1,2,2-tetrahydrodecyl)tetramethyldisiloxane, triisopropyldimethylaminosilane, N-(trimethylsilyl)acetamide, and tris(trimethylsilyl)phosphate.

In some embodiments, the sublimating compound is in an amount of from at least about 40 wt % (e.g., at least about 50 wt %, at least about 60 wt %, at least about 70 wt %, at least about 80 wt %, at least about 90 wt %, at least about 92 wt %, or at least about 95 wt %) to at most about 99.5 wt % (e.g., at most about 99 wt %, at most about 98 wt %, at most about 97 wt %, at most about 96 wt %, at most about 95 wt %, at most about 90 wt %, at most about 85 wt %, or at most about 80 wt %) by weight of the sublimating material.

Certain properties of exemplary sublimating compounds described herein are included in Table 1 below.

TABLE 1

| Sublimating Compound | Vapor Pressure at 25° C. (mm Hg) | Viscosity at 25° C. (Centistokes) | Freezing/ Melting Point (° C.) | Surface Tension at 25° C. (mN/m) |
|---|---|---|---|---|
| t-Butanol | 41.7 | 4.8 (26.7° C.) | 25.5 | 19.2 (26.7° C.) |
| Glacial Acetic Acid | 15 | 1.1 | 16.5 | 27.1 |
| Octamethylcyclotetrasiloxane | 1.0 | 2.3 | 18 | 18.4 |
| Pentafluorophenol | 1.1 | NA | 34-36 | NA |
| 2-Acetyl-5-Methyl Furan | 1.7 | NA | 10 | NA |
| p-Chlorotoluene | 2.7 | 0.78 | 8 | 32.2 |
| Acrylic Acid | 3.8 | 1.13 (20° C.) | 13 | 28.5 (20° C.) |
| Pyrimidine | 3.8 | NA | 20 | 30.9 (20° C.) |
| 4-Methyl Thiazole | 7.5 | NA | 20 | NA |
| p-Xylene | 8.8 | 0.70 | 13 | 27.8 |
| Ethylene Dibromide | 10.0 | 0.73 | 10 | 38.2 |
| Paraldehyde | 10.4 | 1.08 | 13 | 26.2 (20° C.) |
| Ethylenediamine | 14.2 | 1.8 | 11 | 41.6 (20 C.) |
| 1,4-Dioxane | 36.5 | 1.14 | 12 | 32.8 |
| Formic Acid | 42.4 | 1.32 | 8 | 35.3 (30° C.) |
| Hexafluorobenzene | 84.5 | 1.72 | 5 | 20.9 |
| Benzene | 95.4 | 0.69 | 6 | 28.2 |
| Cyclohexane | 97.3 | 1.15 | 7 | 24.4 |
| 4-Pyridinol | 1.7 | NA | 51 | 35.7 |
| Camphene | 2.0 | 1.9 (50° C.) | 47 | 27 |
| 2,2-Dimethyl-1-Propanol | 8.6 | 3.08 (liq) | 54 | 16 (20° C.) |
| Cyanamide (Carbamonitrile) | 9.0 | NA | 46 | 61 (45° C.) |
| Dimethyl Carbonate | 50.0 | 0.58 | 3 | 28.5 |
| Trimethylsilanol | 15.8 | 4.9 | −4.5; −12 | 18.4 |
| Dimethyl Sulfoxide | 1.0 (30° C.) | 2.0 | 18.5 | 45.5 (20° C.) |
| Cyclohexanol | 5 (44° C.) | 37.3 (20° C.) | 23.9 | 34.3 (20° C.) |
| Trimethylacetonitrile | 34.5 | NA | 15 | 25.3 (est.) |

In some embodiments, the sublimating materials described herein can optionally further include at least one (e.g., two or three) surface modification agent. Without wishing to be bound by theory, it is believed that the surface modification agent can form a hydrophobic layer (e.g., a hydrophobic monolayer) on a semiconductor substrate having a pattern disposed on a surface to reduce pattern collapse during a subsequent semiconductor manufacturing process (e.g., a rinsing or drying process). In some embodiments, when the sublimating compound in the sublimating materials itself is a surface modification agent or there is no subsequent rinsing or drying process, the sublimating materials can include no additional surface modification agents.

In some embodiments, the surface modification agent can include a Si-containing compound. In some embodiments, the Si-containing compound can be a disilazane.

For example, the disilazane can be hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

In some embodiments, the Si-containing compound can include a trimethylsilyl group. For example, the Si-containing compound can be trimethylsilyltriflate, N-(trimethylsilyl)dimethylamine, N-(trimethylsilyl)diethylamine, 4-trimethylsilyloxy-3-penten-2-one, bis(trimethylsilyl)sulfate, methoxytrimethylsilane, ethoxytrimethylsilane, N-allyl-N, N-bis(trimethylsilyl)amine, N-(trimethylsilyl)diethylamine, N,N-bis(trimethylsilyl) urea, trimethylsilanol, N-(trimethylsilyl)acetamide, or tris(trimethylsilyl)phosphate.

In some embodiments, the Si-containing compound can be an aminosilane. For example, the aminosilane can be triisopropyl(dimethylamino)silane. In some embodiments, the Si-containing compound can be a siloxane. A siloxane compound can be a disiloxane, an oligosiloxane, a cyclosilxoane, or a polysiloxane. As used herein, the term "oligosiloxane" refers to a compound having 3-6 siloxane units, and the term "polysiloxane" refers to a compound having more than 6 siloxane units. Examples of suitable siloxanes include octamethylcyclotetrasiloxane or 1,3-bis(heptadecafluoro-1,1,2,2-tetrahydrodecyl)tetramethyldisiloxane.

In some embodiments, the surface modification agent is in an amount of from at least about 0.5 wt % (e.g., at least about 1 wt %, at least about 1.5 wt %, at least about 2 wt %, at least about 2.5 wt %, at least about 3 wt %, at least about 3.5 wt %, at least about 4 wt %, or at least about 5 wt %) to at most about 10 wt % (e.g., at most about 9 wt %, at most about 8 wt %, at most about 7 wt %, or at most about 6 wt %) of the sublimating materials described herein.

Certain properties of exemplary surface modification agents described herein are included in Table 2 below.

TABLE 2

| Surface Modifying Agent | Vapor Pressure at 25° C. (mm Hg) | Viscosity at 25° C. (Centistokes) | Freezing/ Melting Point (° C.) | Surface Tension at 25° C. (mN/m) | Both Surface Modification and Sublimation |
|---|---|---|---|---|---|
| Trimethylsilyltriflate | 14 | NA | <0 | 22 (est.) | |
| HMDS | 13.8 | 0.9 | −78 | 18.2 | |
| Trimethylsilyldimethylamine | 67.9 | NA | <0 | NA | |
| Ethoxytrimethyl silane | 111 (22° C.) | NA | −83 | 16.7 | |

TABLE 2-continued

| Surface Modifying Agent | Vapor Pressure at 25° C. (mm Hg) | Viscosity at 25° C. (Centistokes) | Freezing/ Melting Point (° C.) | Surface Tension at 25° C. (mN/m) | Both Surface Modification and Sublimation |
|---|---|---|---|---|---|
| Octamethylcyclotetrasiloxane | 1.0 | 2.3 | 18 | 18.4 | Yes |
| Trimethylsilanol | 15.8 | 4.9 | −4.5; −12; 9.5 | 18.4 | Yes |
| T-Hexyldimethylcholorosilane | 1 (est.) | NA | 14 | 21.6 (est.) | Yes |
| 1,3-Bis(Heptadecafluoro-1,1,2,2-tetrahydrodecyl)tetramethyldisiloxane | <1 | NA | 0 to −5 | 16.4 | Yes |
| Triisoporopyldimethylaminosilane | 0.06 | NA | 27-30 | NA | Yes |
| N-(trimethylsilyl)acetamide | 0.5 | NA | 46-49 | NA | Yes |
| Tris(Trimethylsilyl)Phosphate | <1 | | 2-4 | 19.5(20° C.) | Yes |

In some embodiments, the sublimating materials described herein can optionally further include at least one (e.g., two or three) catalyst. For example, the catalyst can be triflic acid, triflic anhydride, methanesulfonic acid, acetic acid, or acetic anhydride. In some embodiments, the catalyst is in an amount of from at least about 0.1 wt % (e.g., at least about 0.2 wt %, at least about 0.3 wt %, at least about 0.4 wt %, at least about 0.5 wt %, at least about 0.8 wt %, at least about 1 wt %, at least about 2 wt %, or at least about 3 wt %) to about at most about 10 wt % (e.g., at most about 9 wt %, at most about 8 wt %, at most about 7 wt %, or at most about 6 wt %) of the sublimating materials described herein. Without wishing to be bound by theory, it is believed that the catalyst can facilitate reaction between the surface modification agent and the reactive group (e.g., a silanol group) in the semiconductor substrate surface, thereby improving surface treatment of the sublimating materials.

Certain properties of exemplary catalysts described herein are included in Table 3 below.

TABLE 3

| Catalyst | Vapor Pressure at 25° C. (mm Hg) | Viscosity at 25° C. (Centistokes) | Freezing/ Melting Point (° C.) | Surface Tension at 25° C. (mN/m) |
|---|---|---|---|---|
| Triflic Acid | 8 | 1.69 | −40 | 35.6 (est.) |
| Triflic Anhydride | 8 (20° C.) | NA | −80 | 34.1 |
| Methanesulfonic acid | 0.08 (80° C.) | 7.9 | 17-19 | 53.4 |
| Acetic acid | 15 | 1.34 (15° C.) | 16.5 | 28 (20° C.) |
| Acetic anhydride | 5.1 | 0.88 (15° C.) | −73.1 | 31.9 |

In some embodiments, the sublimating materials described herein can optionally further include at least one (e.g., two or three) solvent (e.g., an organic solvent). For example, the solvent can be hexyl acetate, n-butyl acetate, t-butyl acetate, propylene glycol methyl ether acetate (PGMEA), or anisole. In such embodiments, the surface treatment method described herein can further include a solvent evaporation step to remove the solvent before removing the sublimating compound by sublimation.

In some embodiments, the solvent is in an amount of from at least about 0.1 wt % (e.g., at least about 0.5 wt %, at least about 1 wt %, at least about 2 wt %, at least about 5 wt %, at least about 10 wt %, at least about 15 wt %, at least about 20 wt %, or at least about 25 wt %) to at most about 50 wt % (e.g., at most about 45 wt %, at most about 40 wt %, at most about 35 wt %, or at most about 30 wt %) of the sublimating materials described herein.

Certain properties of exemplary solvents described herein are included in Table 4 below.

TABLE 4

| Solvent | Vapor Pressure at 25° C. (mm Hg) | Viscosity at 25° C. (Centistokes) | Freezing/ Melting Point (° C.) | Surface Tension at 25° C. (mN/m) |
|---|---|---|---|---|
| Hexyl acetate | 1.39 | 1.05 (35° C.) | −81 | 26 |
| Butyl acetate | 11.5 | 0.83 | −74 | 25.1 (20° C.) |
| t-Butyl Acetate | 31 (20° C.) | <1.2 | −62 | 22.4 |
| PGMEA | 2.8 | 0.82 | −66 | 26.9 |
| Anisole | 3.5 | 1.0 | −37 | 35 (20° C.) |

In some embodiments, the sublimating materials described herein can include only two types of components, i.e., (1) at least one sublimating compound and (2) at least one surface modification agent or at least one solvent. In some embodiments, when the sublimating compound itself is a surface modification agent, the surface treatment compositions described herein can include only one type of component (i.e., at least one sublimating compound) or only three types of components (i.e., (1) at least one sublimating compound, (2) at least one catalyst, and (3) at least one solvent).

Without wishing to be bound by theory, it is believed that, in some embodiments, the sublimating materials described herein can form a surface treatment layer (e.g., a hydrophobic layer such as a hydrophobic monolayer) on a patterned surface of a semiconductor substrate such that the patterned surface has a water contact angle of at least about 50 degrees (e.g., at least about 55 degrees, at least about 60 degrees, at least about 65 degrees, at least about 70 degrees, at least about 75 degrees, at least about 80 degrees, at least about 85 degrees, at least about 89 degrees, at least about 90 degrees, at least about 95 degrees, or at least about 100 degrees) and/or at most about 175 degrees. Without wishing to be bound by theory, it is believed that such a surface treatment layer can prevent or minimize the collapse of the patterned features (e.g., having a dimension of at most about 20 nm) on a semiconductor substrate surface during a subsequent semiconductor manufacturing process after the surface is treated by the sublimating materials described herein. In addition, it is believed that the removal of the sublimating materials by sublimation can further reduce the pattern collapse as a subsequent rinsing or drying process can be eliminated.

In some embodiments, the sublimating materials described herein can specifically exclude or substantially free of one or more of additive components, in any combination, if more than one. Such additive components are selected from the group consisting of non-aromatic hydrocarbons, protic solvents (e.g., alcohols or amides), lactones (e.g., those with 5- or 6-membered rings), propylene glycol methyl ether acetate, Si-containing compounds (e.g., siloxanes such as disiloxanes; silanes such as alkoxysilanes; silazanes such as disilazanes, cyclic silazanes or heterocyclic silazanes; and those having a Si—H group or an aminosilyl group), polymers, oxygen scavengers, quaternary ammonium compounds including quaternary ammonium hydroxides or salts, amines, bases (such as alkaline bases (e.g., NaOH, KOH, LiOH, Mg(OH)$_2$, and Ca(OH)$_2$) and organic bases), surfactants, defoamers, fluoride-containing compounds (e.g., HF, H$_2$SiF$_6$, H$_2$PF$_6$, HBF$_4$, NH$_4$F, and tetraalkylammonium fluoride), oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids (e.g., those lacking amino groups), cyclic compounds (e.g., cyclic compounds containing at least two rings, such as substituted or unsubstituted naphthalenes, or substituted or unsubstituted biphenylethers) other than the cyclosiloxanes described herein, chelating agents (e.g., azoles, diazoles, triazoles, or tetrazoles), corrosion inhibitors (such as azole or non-azole corrosion inhibitors), buffering agents, guanidine, guanidine salts, pyrrolidone, polyvinyl pyrrolidone, metal salts (e.g., metal halides), and metal-containing catalysts.

In some embodiments, the sublimating materials described herein (which include at least one sublimating compound and optionally one or more other components) have relatively low metal and particle contents. In some embodiments, the sublimating materials can have a total metal content of 0 to 1 ppb (e.g., 0 to 500 ppt or 0 to 300 ppt) in mass. In some embodiments, the total number of the particles having a size of 0.1 μm or more in a sublimating material described herein is at most 200 (e.g., at most 150, at most 100, at most 80, at most 60, or at most 50) per 1 ml of the sublimating material.

In some embodiments, the surface treatment methods described herein can optionally further include contacting the surface of a substrate with at least one aqueous cleaning solution before contacting the surface with a sublimating material. In such embodiments, the at least one aqueous cleaning solution can include water, an alcohol, aqueous ammonium hydroxide, aqueous hydrochloric acid, aqueous hydrogen peroxide, an organic solvent, or a combination thereof.

In some embodiments, the surface treatment methods described herein can optionally further include contacting the surface of a substrate with a first rinsing solution (e.g., water, an organic solvent such as isopropanol, or a combination thereof) after contacting the surface with the at least one aqueous cleaning solution but before contacting the surface with the sublimating material. In some embodiments, the surface treatment methods described herein can optionally further include contacting the surface with a second rinsing solution (e.g., water, an organic solvent such as isopropanol, or a combination thereof) after contacting the surface with the sublimating material. In some embodiments, the surface treatment methods described herein can optionally further include drying the surface (e.g., after any of the steps of contacting the surface with first rinsing solution, the sublimating material, or the second rinsing solution). In some embodiments, the surface treatment methods described herein can further include removing the surface treatment layer from the surface.

In some embodiments, this disclosure provides methods for cleaning a semiconductor substrate (e.g., a wafer) having a pattern disposed on a surface of the substrate. Such methods can be performed, for example, by:

a) optionally, contacting the surface with an aqueous cleaning solution;

b) optionally, contacting the surface with a first rinsing solution;

c) contacting the surface with a sublimating material described herein, in which the sublimating material includes at least one sublimating compound;

d) maintaining the sublimating material on the surface for a time sufficient to modify the surface;

e) optionally removing any solvent (if present) on the surface;

f) solidifying the sublimating material on the surface;

g) removing by sublimation the sublimating material disposed on the surface (which can form a surface treatment layer);

h) optionally, contacting the surface with a second rinsing solution;

i) optionally drying the surface; and j) optionally, removing the surface treatment layer to form a cleaned, patterned surface.

In such embodiments, the pattern on the semiconductor substrate surface can include a feature having a dimension of at most about 20 nm.

In step a) of the above described methods, the substrate (e.g., a wafer) bearing a patterned surface can optionally be treated with one or more aqueous cleaning solutions. When the patterned surface is treated with two or more aqueous cleaning solutions, the cleaning solutions can be applied sequentially. The aqueous cleaning solutions can be water alone, an organic solvent alone, or can be solutions containing water, a solute, and optionally an organic solvent. In some embodiments, the aqueous cleaning solutions can include water, an alcohol (e.g., a water soluble alcohol such as isopropanol), an aqueous ammonium hydroxide solution, an aqueous hydrochloric acid solution, an aqueous hydrogen peroxide solution, an organic solvent (e.g., a water soluble organic solvent), or a combination thereof.

In step b), the cleaning solution from step a) can be optionally rinsed away using a first rinsing solution. The first rinsing solution can include water, an organic solvent (e.g., isopropanol), or an aqueous solution containing an organic solvent. In some embodiments, the first rinsing solution is at least partially miscible with the cleaning solution used in step a). In some embodiments, step b) can be omitted when the cleaning solution used in step a) is not moisture sensitive or does not contain any appreciable amount of water. In some embodiments, step (b) can be used in the absence of step a).

In step c), the substrate surface can be treated with a sublimating material described herein to form a modified surface having a surface treatment layer (e.g., a hydrophobic layer). A semiconductor substrate can be contacted with the sublimating material by any suitable method, such as placing the sublimating material into a tank and immersing and/or submerging the semiconductor substrate into the sublimating material, spraying the sublimating material onto the semiconductor substrate, streaming the sublimating material onto the semiconductor substrate, or any combinations thereof. In some embodiments, this step can be performed at a temperature of about 20-35° C. In some embodiments, the sublimating material can be pre-processed by using ion exchange, distillation, sublimation and filtration processes to meet the ultrapure material requirements for this process.

In step d), the sublimating material can be maintained on the surface for a period of time ranging from about 10 seconds to about 300 seconds to modify the surface.

In step e), when the sublimating material includes a solvent, the solvent can be removed (e.g., by evaporation) before sublimation of the sublimating material. In some embodiments, the solvent can be removed by evaporation, such as by heating the semiconductor substrate with a heating means such as a hotplate or infrared lamp, by placing the semiconductor substrate in vacuum (e.g., in a chamber), or both. In some embodiments, when the sublimating material includes a solvent, solvent saturation and blanketing gas ($N_2$, clean dry air, etc.) for the tool tank (which holds the sublimating material) and chamber can be used to modulate evaporation for the purpose of preventing micro and nano bubble "bumping", which can result in pattern substrate defects during the solvent removal process. It is believed that this additional process can improve sublimation process uniformity and provide a better static friction free drying process and minimize substrate defectivity.

In step f), the sublimating material can be solidified by lowering the temperature of the semiconductor substrate such as cooling the backside of the semiconductor substrate or cooling the chamber in which the semiconductor substrate is placed. The temperature to solidify or freeze the sublimating material can be at most about 15° C. (e.g., at most about 10° C., at most about 5° C., at most about 0° C., at most about −5° C., at most about −10° C., or at most about −20° C.) or at least about −30° C. In some embodiments, when a sublimating material having a melting point at least about 18° C. is used, it may be necessary to use heating jacket for dispense canister and transfer lines to prevent premature fluid solidification on transfer of the sublimating material to the substrate. In such embodiments, the sublimating material can be solidified at ambient temperature.

In step g), the sublimating material can be sublimed by increasing the substrate temperature, reducing substrate chamber pressure (e.g., after placing the substrate in a chamber), or both to achieve an acceptable condition for uniform sublimation based on the phase diagram of the sublimating material. In some embodiments, an inline endpoint detector can be used to verify completion of the sublimation process. The pressure and temperature of the substrate chamber can then be slowly brought to standard temperature and pressure (STP) conditions under nitrogen gas flow. The substrate can then be removed from the substrate chamber. Cycles of increasing temperature (with $N_2$ flow) and/or reducing pressure can then be used to clean the chamber and remove any trace amounts of the sublimating material from chamber. Without wishing to be bound by theory, it is believed that this sublimation step can minimize pattern collapse on the semiconductor substrate (e.g., by eliminating the subsequent rinsing and/or drying steps).

In step h), after the substrate surface is treated with a sublimating material, the surface can be rinsed with a second rinsing solution. The second rinsing solution can include water, an organic solvent (e.g., isopropanol), or an aqueous solution containing an organic solvent. In some embodiments, this step can be performed at a temperature of about 20-70° C. In some embodiments, this rinsing step can be omitted when all of the sublimating material has been removed by sublimation and there is no substantial residues left on the semiconductor substrate.

In step i), the substrate surface can be dried (e.g., by using a pressurized gas). Without wishing to be bound by theory, it is believed that, after the substrate surface is treated with a sublimating material described herein, the collapse of patterns on the surface during this drying step is minimized. In some embodiments, this drying step can be omitted when the rinsing step after sublimation is eliminated.

In step j), if a surface treatment layer (e.g., a hydrophobic layer) is formed on the semiconductor substrate, the surface treatment layer can optionally be removed. In general, the surface treatment layer can be removed by a number of methods depending on the chemical characteristics of the modified surface. Suitable methods for removing the surface treatment layer include plasma sputtering; plasma ashing; thermal treatment at atmospheric or sub atmospheric pressure; treatment with an acid, base, oxidizing agent or solvent containing condensed fluid (e.g., supercritical fluids such as supercritical $CO_2$); vapor or liquid treatment; UV irradiation; or combinations thereof.

The semiconductor substrate having a cleaned, patterned surface prepared by the methods described herein can be further processed to form one or more circuits on the substrate or can be processed to form into a semiconductor device (e.g., an integrated circuit device such as a semiconductor chip) by, for example, assembling (e.g., dicing and bonding) and packaging (e.g., chip sealing).

In some embodiments, this disclosure features articles (e.g., an intermediate semiconductor article formed during the manufacturing of a semiconductor device) that includes a semiconductor substrate, and a sublimating material described herein supported by the semiconductor substrate.

The present disclosure is illustrated in more detail with reference to the following examples, which are for illustrative purposes and should not be construed as limiting the scope of the present disclosure.

EXAMPLES

Example 1

A patterned substrate is cleaned using RCA clean sequence (dilute hydrofluoric acid/ammonium hydrogen peroxide/hydrogen peroxide and hydrochloric acid), and rinsed with water, isopropanol or other rinse or combination of rinses using a single wafer tool (SWT) processor equipped with substrate spinning, temperature control, and chemistry dispense. The substrate is maintained with a liquid on the surface prior to surface modification and sublimation to prevent stiction drying.

A sublimating material containing 97% dimethyl carbonate (i.e., a sublimating compound) and 3% trimethylsilyltriflate (i.e., a surface modification agent) is used at 25° C. to rinse any residual chemicals (e.g., any cleaning or other rinse liquids) from the surface of the substrate and simultaneously surface modifying the substrate to minimize the surface free energy. Once the substrate is surface modified, the sublimating material is phase changed (i.e., from liquid to solid) using substrate, substrate chamber and/or chemistry tank temperature controls. In this example, the substrate temperature is reduced to 0° C. to solidify the dimethyl carbonate solution. This substrate pattern freezing step is followed by sublimation of the dimethyl carbonate, which is performed by increasing substrate temperature, reducing substrate chamber pressure, or both to achieve an acceptable condition for uniform sublimation based on the phase diagram of the sublimating compound. For this example, the substrate temperature is maintained at 0° C. and the chamber pressure is slowly ramped down to 16.5 mm Hg to provide suitable sublimation conditions.

An inline endpoint detector is used to verify completion of the sublimation process. The pressure and temperature of the substrate chamber are then slowly brought to STP (Standard Temperature and Pressure) conditions under dry nitrogen gas. An optional surface modification removal step can be executed by treating the pattern substrate with a plasma, UV irradiation or chemical vapor that breaks the Si—O—CR$_3$ bonds of the modified surface to reconstituting a hydroxylated surface for subsequent processing steps. The substrate is then removed from the chamber.

The sublimation processed substrate patterns, which contains 22:1 aspect ratio cylindrical Si pillars with average width at ½ height of 10-15 nm and average height of 550 nm, are analyzed by scanning electron microscopy over three randomly selected sites at a magnification of 50000× and the number of uncollapsed silicon pillars are tabulated. The uncollapsed Si-pillars at the three sites are then averaged and compared to the average of total Si pillars on the unprocessed sample for the 3 sites. An uncollapsed % is calculated by dividing the uncollapsed pillar number by the total starting pillar count and multiplying by 100. In this way, the effectiveness of the sublimation process in preventing pattern collapse can be assessed.

Example 2

A patterned substrate is cleaned using RCA clean sequence (DHF/SC-1/SC-2) and rinsed with water, isopropanol or other rinse or combination of rinses using a single wafer tool (SWT) processor equipped with substrate spinning, temperature control, and chemistry dispense. The substrate is maintained with liquid on the surface prior to surface modification and sublimation to prevent stiction drying.

A sublimating material containing 60% octamethylcyclotetrasiloxane (i.e., a sublimating compound having surface modification functions), 1% triflic acid (i.e., a catalyst), and 39% n-butylacetate (i.e., a solvent) is used to rinse the substrate of any residue chemicals (e.g., any prior cleaning or rinse liquids) and then surface modify the substrate at 25° C. The n-butyl acetate is slowly evaporated from the substrate by increasing wafer temperature and reducing pressure to achieve a smooth evaporation without bumping. Bumping occurs when a liquid is heated or has its pressure reduced very rapidly, during which a small vapor bubble grows quickly to a large vapor bubble and displaces the surrounding liquid at high speed, potentially causing damage to surrounding features. The sublimating material is then phase changed (i.e., from liquid to solid) in the substrate pattern using substrate, substrate chamber and chemistry tank temperature controls. In this example, the substrate temperature is reduced to 15° C. to solidify the octamethylcyclotetrasiloxane. The substrate pattern freezing step is followed by sublimation of the octamethylcyclotetrasiloxane, which is performed by increasing substrate temperature, reducing substrate chamber pressure, or both to achieve an acceptable condition for uniform sublimation based on the phase diagram of the sublimating compound. In this example, the substrate temperature is maintained at 15° C. and the chamber pressure is slowly ramped down to 0.25 mm Hg to provide suitable sublimation conditions.

An inline endpoint detector is used to verify completion of the sublimation process. The pressure and temperature are then slowly brought to STP (Standard Temperature and Pressure) conditions under dry nitrogen gas. An optional surface modification removal step can be executed by treating the pattern substrate with a plasma, UV irradiation or chemical vapor that breaks the Si—O—CR$_3$ bonds of the modified surface to reconstitute a hydroxylated surface for subsequent processing steps. The substrate is then removed from the chamber.

The sublimation processed substrate patterns, which contains 22:1 aspect ratio cylindrical Si pillars with average width at ½ height of 10-15 nm and average height of 550 nm, are analyzed by scanning electron microscopy over three randomly selected sites at a magnification of 50,000× and the number of uncollapsed silicon pillars are tabulated. The uncollapsed Si-pillars at the three sites are then averaged and compared to the average of total Si pillars on the unprocessed sample for the 3 sites. An uncollapsed % is calculated by dividing the uncollapsed pillar number by the total starting pillar count and multiplying by 100. In this way, the effectiveness of the sublimation chemistry and process in preventing pattern collapse can be assessed.

While the invention has been described in detail with reference to certain embodiments thereof, it will be understood that modifications and variations are within the spirit and scope of that which is described and claimed.

What is claimed is:

1. A method of treating a substrate, comprising:
   a) providing a sublimating material comprising a sublimating compound in an amount of from about 40% by weight to about 99.5% by weight of the sublimating material and a surface modification agent in an amount of from about 0.5% by weight to about 10% by weight of the sublimating material;
   b) supplying the sublimating material to a substrate having a pattern disposed on a surface thereof;
   c) maintaining the sublimating material on the surface for a time sufficient to modify the surface;
   d) solidifying the sublimating material on the surface; and
   e) removing by sublimation the sublimating material disposed on the surface;
   wherein the sublimating compound is selected from the group consisting of glacial acetic acid, octamethylcyclotetrasiloxane, pentafluorophenol, 2-acetyl-5-methyl furan, p-chlorotoluene, acrylic acid, pyrimidine, 4-methyl thiazole, p-xylene, ethylene dibromide, paraldehyde, ethylenediamine, 1,4-dioxane, formic acid, hexafluorobenzene, benzene, cyclohexane, 4-pyridinol, camphene, 2,2-dimethyl-1-propanol, cyanamide, dimethyl carbonate, trimethylsilanol, dimethyl sulfoxide, cyclohexanol, and trimethylacetonitrile.

2. The method of claim 1, wherein the sublimating compound has a melting point of from about −20° C. to about 60° C. and a vapor pressure of at least about 1 mm Hg at 25° C.

3. The method of claim 1, wherein the sublimating compound has a melting point of from about 0° C. to about 20° C.

4. The method of claim 1, wherein the sublimating compound has a surface tension of at most about 65 mN/m at 25° C.

5. The method of claim 1, wherein the sublimating compound has a viscosity of at most about 5 centistokes at 25° C.

6. The method of claim 1, wherein the sublimating compound is selected from the group consisting of glacial acetic acid, octamethylcyclotetrasiloxane, pentafluorophenol, 2-acetyl-5-methyl furan, p-chlorotoluene, acrylic acid, pyrimidine, 4-methyl thiazole, p-xylene, ethylene dibromide, paraldehyde, ethylenediamine, 1,4-dioxane, hexafluorobenzene, benzene, cyclohexane, 4-pyridinol, camphene, 2,2-dimethyl-1-propanol, cyanamide, dimethyl carbonate, trimethylsilanol, cyclohexanol, and trimethylacetonitrile.

7. The method of claim 1, wherein the sublimating compound is in an amount of from about 50% by weight to about 99.5% by weight of the sublimating material.

8. The method of claim 1, wherein the surface modification agent is in an amount of from about 0.5% by weight to about 9% by weight of the sublimating material.

9. The method of claim 1, wherein the surface comprises $SiO_2$, SiN, TiN, SiOC, SiON, Si, SiGe, Ge, or W.

10. The method of claim 1, wherein the sublimating material further comprises a catalyst.

11. The method of claim 10, wherein the catalyst is triflic acid, triflic anhydride, methanesulfonic acid, acetic acid, or acetic anhydride.

12. The method of claim 10, wherein the catalyst is in an amount of from about 0.1% by weight to about 10% by weight of the sublimating material.

13. The method of claim 1, wherein the sublimating material further comprises a solvent.

14. The method of claim 13, further comprising a solvent evaporation step.

15. The method of claim 13, wherein the solvent is hexyl acetate, n-butyl acetate, t-butyl acetate, propylene glycol methyl ether acetate (PGMEA), or anisole.

16. The method of claim 1, wherein the surface modification agent comprises a Si-containing compound.

17. The method of claim 16, wherein the Si-containing compound is a disilazane.

18. The method of claim 17, wherein the disilazane is hexamethyldisilazane, heptamethyldisilazane, N-methyl hexamethyldisilazane, 1,3-diphenyltetramethyldisilazane, or 1,1,3,3-tetraphenyl-1,3-dimethyldisilazane.

19. The method of claim 16, wherein the Si-containing compound comprises a trimethylsilyl group.

20. The method of claim 19, wherein the Si-containing compound is trimethylsilyltriflate, N-(trimethylsilyl)dimethylamine, N-(trimethylsilyl)diethylamine, 4-trimethylsilyloxy-3-penten-2-one, bis(trimethylsilyl)sulfate, methoxytrimethylsilane, ethoxytrimethylsilane, N-allyl-N,N-bis(trimethylsilyl)amine, N-(trimethylsilyl)diethylamine, N,N-bis-trimethylsilyl urea, trimethylsilanol, N-(trimethylsilyl)acetamide, or tris(trimethylsilyl)phosphate.

21. The method of claim 16, wherein the Si-containing compound is an aminosilane.

22. The method of claim 21, wherein the aminosilane is triisopropyl(dimethylamino)silane.

23. The method of claim 16, wherein the Si-containing compound is a siloxane.

24. The method of claim 23, wherein the siloxane is octamethylcyclotetrasiloxane or 1,3-bis(heptadecafluoro-1,2,2-tetrahydrodecyl)tetramethyldisiloxane.

* * * * *

UNITED STATES PATENT AND TRADEMARK OFFICE
CERTIFICATE OF CORRECTION

| | | |
|---|---|---|
| PATENT NO. | : 11,508,569 B2 | Page 1 of 1 |
| APPLICATION NO. | : 16/983119 | |
| DATED | : November 22, 2022 | |
| INVENTOR(S) | : William A. Wojtczak et al. | |

It is certified that error appears in the above-identified patent and that said Letters Patent is hereby corrected as shown below:

In the Claims

<u>Column 16</u>
Lines 48-49, in Claim 24, delete "1,2,2" and insert -- 1,1,2,2 --

Signed and Sealed this
Tenth Day of January, 2023

Katherine Kelly Vidal
*Director of the United States Patent and Trademark Office*